(12) United States Patent
Ishikawa et al.

(10) Patent No.: US 8,741,396 B2
(45) Date of Patent: Jun. 3, 2014

(54) METHOD FOR FORMING AMORPHOUS CARBON NITRIDE FILM, AMORPHOUS CARBON NITRIDE FILM, MULTILAYER RESIST FILM, METHOD FOR MANUFACTURING SEMICONDUCTOR DEVICE, AND STORAGE MEDIUM IN WHICH CONTROL PROGRAM IS STORED

(75) Inventors: Hiraku Ishikawa, Sendai (JP); Eiichi Nishimura, Nirasaki (JP)

(73) Assignee: Tokyo Electron Limited (JP)

( * ) Notice: Subject to any disclaimer, the term of this patent is extended or adjusted under 35 U.S.C. 154(b) by 382 days.

(21) Appl. No.: 13/060,821

(22) PCT Filed: Jun. 30, 2009

(86) PCT No.: PCT/JP2009/061907
§ 371 (c)(1),
(2), (4) Date: Mar. 21, 2011

(87) PCT Pub. No.: WO2010/024037
PCT Pub. Date: Mar. 4, 2010

(65) Prior Publication Data
US 2011/0201206 A1    Aug. 18, 2011

(30) Foreign Application Priority Data

Aug. 28, 2008    (JP) ................................ 2008-219359

(51) Int. Cl.
*H01L 21/311*    (2006.01)
(52) U.S. Cl.
USPC .............. 427/589; 257/E21.249; 257/E21.24; 438/703; 438/778
(58) Field of Classification Search
USPC .................. 438/703, 778; 428/443; 423/384; 257/E21.24, E21.249; 427/569, 427/255.394
See application file for complete search history.

(56) References Cited

U.S. PATENT DOCUMENTS 4,504,519 A * 3/1985 Zelez ........................... 427/577
5,606,056 A  2/1997 Kouvetakis et al.
(Continued)

FOREIGN PATENT DOCUMENTS

JP    2000072415    3/2000
JP    2000-285437   10/2000
(Continued)

OTHER PUBLICATIONS

Korean Office Action—Korean Application No. 10-2011-7000272 issued on Jan. 17, 2012, citing JP 2000-285437, US 5606056, and JP 2004-277882.

(Continued)

*Primary Examiner* — William F Kraig
*Assistant Examiner* — Edward Chin
(74) *Attorney, Agent, or Firm* — Cantor Colburn LLP (57) ABSTRACT

An amorphous carbon film, which has excellent etching resistance and is capable of reducing reflectance when a resist film is exposed to light, is form. A method for manufacturing a semiconductor device includes forming an object film to be etched on a wafer, supplying a process gas containing a CO gas and an $N_2$ gas into a processing container, forming an amorphous carbon nitride film from the supplied CO gas and $N_2$ gas, forming a silicon oxide film on the amorphous carbon nitride film, forming an ArF resist film on the silicon oxide film, patterning the ArF resist film, etching the silicon oxide film by using the ArF resist film as a mask, etching the amorphous carbon nitride film by using the silicon oxide film as a mask, and etching the object film to be etched by using the amorphous carbon nitride film as a mask.

10 Claims, 9 Drawing Sheets

(56) References Cited

U.S. PATENT DOCUMENTS

| | | | | |
|---|---|---|---|---|
| 6,486,082 | B1* | 11/2002 | Cho et al. | 438/789 |
| 6,872,503 | B2* | 3/2005 | Wheland et al. | 430/270.1 |
| 7,473,950 | B2* | 1/2009 | Fournier | 257/295 |
| 7,498,066 | B2* | 3/2009 | Kumar et al. | 427/569 |
| 7,989,272 | B2* | 8/2011 | Maekawa | 438/149 |
| 2004/0242953 | A1* | 12/2004 | Good | 600/7 |
| 2007/0262705 | A1* | 11/2007 | Fukuda et al. | 313/504 |
| 2009/0014887 | A1* | 1/2009 | Ohtake et al. | 257/774 |
| 2009/0283856 | A1* | 11/2009 | Huang et al. | 257/532 |
| 2010/0003825 | A1* | 1/2010 | Ogasawara et al. | 438/710 |
| 2010/0006976 | A1* | 1/2010 | Kume et al. | 257/516 |
| 2010/0032838 | A1* | 2/2010 | Kikuchi et al. | 257/751 |
| 2010/0105213 | A1* | 4/2010 | Ishikawa et al. | 438/717 |
| 2010/0203339 | A1* | 8/2010 | Eryilmaz et al. | 428/408 |
| 2011/0146787 | A1* | 6/2011 | Allen et al. | 136/256 |
| 2011/0201206 | A1* | 8/2011 | Ishikawa et al. | 438/703 |
| 2012/0012166 | A1* | 1/2012 | Atanackovic | 136/252 |
| 2012/0032288 | A1* | 2/2012 | Tomioka | 257/421 |
| 2012/0103182 | A1* | 5/2012 | Sugimoto | 92/165 R |
| 2012/0121349 | A1* | 5/2012 | Mihic et al. | 408/143 |

FOREIGN PATENT DOCUMENTS

| | | | |
|---|---|---|---|
| JP | 2002-012972 | 1/2002 | |
| JP | 2004-066664 | 3/2004 | |
| JP | 2004-217977 | 8/2004 | |
| JP | 2004-277882 | 10/2004 | |
| JP | 2008-141009 | 6/2008 | |
| JP | WO2008105321 | * 9/2008 | 216/81 |

OTHER PUBLICATIONS

International Search Report—PCT/JP2009/061907 dated Aug. 4, 2009.

* cited by examiner

<EXPOSURE PROCESS>

<DEVELOPING PROCESS>

FIG. 5

| GAS FLOW RATE | | | AMORPHOUS CARBON NITRIDE(AMORPHOUS CARBON) FILM | | |
|---|---|---|---|---|---|
| CO | Ar | N$_2$ | CONTENT OF N ATOMS (Atomic %) | CONTENT OF C ATOMS (Atomic %) | REFLECTANCE |
| 18 | 1 | 0 | 0.0 | 96.8 | 4.42 |
| 17 | 1 | 1 | 6.7 | 88.2 | 2.16 |
| 17 | 1 | 2 | 10.0 | 83.2 | 4.20 |

| LOST FILM THICKNESS *AMOUNT OF LOSS IN EACH FILM DURING SAME EVALUATION | | G LINE RESIST FILM (COMPARATIVE FILM 1) | AMORPHOUS CARBON FILM (FILM 1) | AMORPHOUS CARBON NITRIDE FILM (FILM 2) | AMORPHOUS CARBON NITRIDE FILM (FILM 3) |
|---|---|---|---|---|---|
| | FLOW RATE CO/Ar/$N_2$ | | 18/1/0 | 17/1/1 | 17/1/2 |
| | CENTER | Δ70nm | Δ37.6nm | Δ42.7nm | Δ54.8nm |
| | END PORTION | Δ90nm | Δ37.8nm | Δ48.6nm | Δ57.7nm |

METHOD FOR FORMING AMORPHOUS CARBON NITRIDE FILM, AMORPHOUS CARBON NITRIDE FILM, MULTILAYER RESIST FILM, METHOD FOR MANUFACTURING SEMICONDUCTOR DEVICE, AND STORAGE MEDIUM IN WHICH CONTROL PROGRAM IS STORED

TECHNICAL FIELD

The present invention relates to a method for forming an amorphous carbon nitride film applied to a semiconductor device, an amorphous carbon nitride film, a multilayer resist film, a method for manufacturing a semiconductor device, and a storage medium in which a control program is stored.

BACKGROUND ART

In manufacturing processes of a semiconductor device, plasma etching is performed by using a photoresist, in which a pattern is formed using a photolithography technology, as an etching mask, and a circuit pattern is transferred to an object film to be etched by the plasma etching. When a pattern is projected onto the photoresist via photolithography, in the CD of a 45 nm generation, an ArF resist is used as the photoresist to achieve minuteness and an ArF laser beam having a wavelength of 193 nm is used as light to which the ArF resist is exposed.

However, the ArF resist has low plasma resistance. Accordingly, a technology of stacking a $SiO_2$ film and a resist film having high plasma resistance below the ArF resist and patterning by using the multilayer resist film has been suggested.

Also, a technology in which an amorphous carbon film, as a replacement of the $SiO_2$ film or as an anti-reflection layer, formed via a CVD (Chemical Vapor Deposition) process using a hydrocarbon gas and an inert gas is included in the multiplayer resist film (for example, refer to Patent Document 1) has been suggested.

Also, recently, a patterning technology that does not use a photolithography technology in a part of process has been suggested. In detail, for example, a multilayer resist film is formed by stacking an $SiO_2$ film below an ArF resist film, and an amorphous carbon film below the $SiO_2$ film, and the multilayer resist film is patterned as follows. In detail, first, the ArF resist film is patterned, and then the $SiO_2$ film is etched by using the patterned ArF resist film. Then, the amorphous carbon film is etched by using the patterned $SiO_2$ film. As a result, a pattern formed on the ArF resist film may be transferred to the amorphous carbon film without having to use a photolithography technology in processes other than a patterning process of the ArF resist film.

(Patent Document 1) Japanese Laid-Open Patent Publication No. 2002-12972

DISCLOSURE OF THE INVENTION

Technical Problem

However, when an ArF resist film is patterned by using a photolithography technology, the ArF resist film is exposed not only to incident light but also to light reflected at a base of the ArF resist film. As a result, even if a desired pattern is accurately projected onto the ArF resist film by the incident light, a boundary portion of the pattern projected onto the ArF resist film becomes vague due to exposure to the reflected light, which is not controlled. Thus, high precision patterning is disturbed.

To address the above problem, the present invention provides an amorphous carbon film formed below a resist film, having excellent etching resistance and capable of reducing reflectance of irradiated light when the resist film is exposed to light.

Technical Solution

To address the above problems, the inventor has discovered the following four matters after examination.

(1) Etching resistance may be improved as a content of carbon atoms in an amorphous carbon film is increased.

(2) It is unavoidable to reduce a content of hydrogen atoms in order to increase a content of carbon atoms.

(3) An amorphous carbon film whose content of hydrogen atoms is very low may be formed by using, instead of a hydrocarbon gas, carbon monoxide, which does not contain hydrogen atoms in molecules, as a gas for supplying carbon in a CVD method.

(4) By additionally doping a nitrogen gas into an amorphous carbon film whose content of hydrogen atoms is very low, a possibility that irradiated light is reflected at the amorphous carbon film when a resist film is exposed to light may be decreased.

According to an aspect of the present invention, there is provided a method for forming an amorphous carbon nitride film, the method including: disposing a target object inside a processing container; supplying a process gas containing a carbon monoxide gas and a nitrogen gas into the processing container; and forming an amorphous carbon nitride film on the target object by decomposing the carbon monoxide gas and the nitrogen gas inside the processing container.

Accordingly, an amorphous carbon nitride film having excellent etching resistance and capable of reducing reflectance of irradiated light when a resist film is exposed to light may be formed. Accordingly, the resist film may be accurately patterned when a pattern is formed by using a photolithography technology. Also, a good pattern may be formed on an underlayer film thereof in a following etching process because of high etching resistance, and thus an accurate pattern transfer may be realized without generating deformations in the pattern of an object film to be etched.

A content of nitrogen atoms in the amorphous carbon nitride film may be below or equal to 10% of carbon atoms contained in the same film.

The amorphous carbon nitride film may be formed on the target object by using a plasma CVD apparatus.

The plasma CVD apparatus may be a parallel plate type in which an upper electrode and a lower electrode are provided inside the processing container, and generate plasma from the process gas by applying high frequency power to at least the upper electrode in a state where the target object is disposed on the lower electrode. High frequency power for bias may be applied to the lower electrode. The upper electrode may be a carbon electrode. The process gas may include an inert gas.

According to another aspect of the present invention, there is provided an amorphous carbon nitride film formed on a target object via plasma CVD by using a process gas containing a carbon monoxide gas and a nitrogen gas.

According to another aspect of the present invention, there is provided a multilayer resist film including: an amorphous carbon nitride film formed on an object film to be etched by supplying a process gas containing a carbon monoxide gas and a nitrogen gas into a processing container and decomposing the carbon monoxide gas and the nitrogen gas inside the processing container; a silicon-based thin film formed on the amorphous carbon nitride film; and a photoresist film formed on the silicon-based thin film.

According to another aspect of the present invention, there is provided a method for manufacturing a semiconductor device, the method including: forming an object film to be etched on a target object; supplying a process gas containing a carbon monoxide gas and a nitrogen gas into a processing container; forming an amorphous carbon nitride film on the target object by decomposing the carbon monoxide gas and the nitrogen gas inside the processing container; forming a silicon-based thin film on the amorphous carbon nitride film; forming a photoresist film on the silicon-based thin film; patterning the photoresist film; etching the silicon-based thin film by using the photoresist film as an etching mask; transferring the photoresist pattern by etching the amorphous carbon nitride film by using the silicon-based thin film as an etching mask; and etching the object film to be etched by using the amorphous carbon nitride film as an etching mask.

The photoresist film may be an ArF resist film and is patterned by using light having a wavelength of 193 nm.

According to another aspect of the present invention, there is provided a computer readable storage medium having recorded thereon a control program operating in a computer, wherein the control program controls a film-forming apparatus for forming an amorphous carbon nitride film in such a way that the above mentioned method is executed.

According to another aspect of the present invention, there is provided a method for forming an amorphous carbon nitride film, the method including: disposing a target object inside a processing container; supplying a gas containing only carbon atoms and oxygen atoms, and a nitrogen gas into the processing container; and forming an amorphous carbon nitride film on the target object by using plasma inside the processing container.

Advantageous Effects

As described above, according to the present invention, an amorphous carbon film having excellent etching resistance and capable of reducing reflectance of irradiated light when a resist film is exposed to light may be formed.

EXPLANATION ON REFERENCE NUMERALS

10: Plasma CVD Apparatus
105: Susceptor
115: Lower Electrode
130: High Frequency Power Supply
150: Shower Head
155: Gas Supply Source
175: High Frequency Power Supply
200: Controller
330: Amorphous Carbon Nitride Film
335: Silicon Oxide Film
340: Anti-reflection Film
345: ArF Resist Film

BEST MODE FOR CARRYING OUT THE INVENTION

Hereinafter, the present invention will be described in detail by explaining exemplary embodiments of the invention with reference to the attached drawings. Like reference numerals in the drawings and the description below denote like elements, and thus overlapping descriptions will be omitted. Also in the specification, 1 mTorr is $(10^{-3} \times 101325/760)$ Pa and 1 sccm is $(10^{-6}/60)$ m$^3$/sec.

Figure 1:
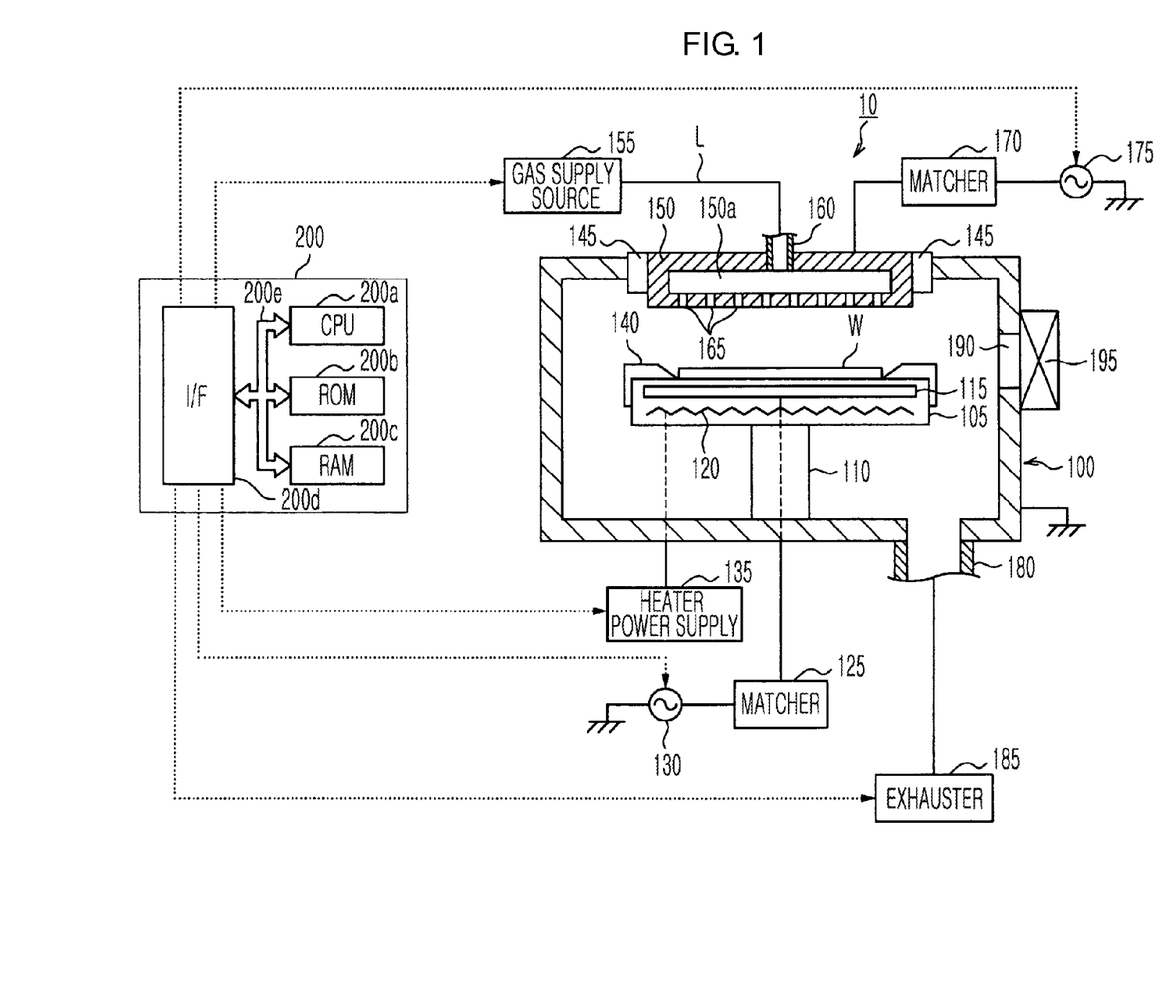
FIG. 1 is a longitudinal-sectional view of a plasma CVD apparatus applicable to forming an amorphous carbon nitride film, according to an embodiment of the present invention.

First, an example of a film-forming process to which a method for forming an amorphous carbon nitride film according to an embodiment of the present invention is applicable will be described by using a plasma CVD apparatus of a parallel plate type. FIG. 1 is a schematic cross-sectional view of a plasma CVD apparatus 10 of a parallel plate type.

(Configuration of Plasma CVD Apparatus)

The plasma CVD apparatus 10 includes a processing container 100 having a cylindrical shape. The processing container 100 is grounded. A susceptor 105 on which a wafer W is placed is provided inside the processing container 100. The susceptor 105 is held by holder. A lower electrode 115 is buried near a holding surface of the susceptor 105, and a heater 120 is buried below the lower electrode 115. A high frequency power supply 130 is connected to the lower electrode 115 through a matcher 125. As occasion demands, high frequency power for bias is output from the high frequency power supply 130 and applied to the lower electrode 115. The heater is connected to a heater power supply 135, and an alternating current voltage is applied from the heater power supply 135 as occasion demands, thereby adjusting the wafer W to a desired temperature. A guide ring 140 is provided on an outer edge portion of an upper surface of the susceptor, so as to guide the wafer W.

The processing container 100 is opened in a cylindrical shape at a ceiling portion, and a shower head 150 having a cylindrical shape is inserted into the opening through an insulator 145. A buffer area 150a for diffusing a gas is provided inside the shower head 150. A desired gas supplied from a gas supply source 155 is introduced into the shower head 150 from a gas inlet 160 through a gas line L, and is supplied into the processing container from a plurality of gas ejection holes 165 through the buffer area 150a. The desired gas may be a carbon monoxide gas, an argon gas, and a nitrogen gas. A high frequency power supply 175 is connected to the shower head 150 through a matcher 170. Accordingly, the shower head 150 also may function as an upper electrode. In detail, high frequency power for plasma generation is output from the high frequency power supply 175 and is applied to the upper electrode (the shower head 150), and thus discharge is generated by an electric field generated between the upper electrode and the lower electrode. Consequently, a gas supplied into the processing container is excited, and thus plasma is generated.

An exhaust pipe 180 is provided on a bottom wall of the processing container, and is connected to an exhauster 185 including a vacuum pump (not shown). The exhauster 185 is activated so as to depressurize the inside of the processing container 100 to a desired vacuum level. A transfer opening 190 for transferring the wafer W from and to the processing container 100, and a gate valve 195 for opening and closing the transfer opening 190, are provided on a wall surface of the processing container 100.

The plasma CVD apparatus 10 configured as above is controlled by a controller 200. The controller 200 includes a CPU 200a, a ROM 200b, a RAM 200c, and an interface 200d. The CPU 200a, the ROM 200b, the RAM 200c, and the interface 200d are connected to each other via a bus 200e.

The ROM 200b stores a control program (recipe) or various programs indicating a method for forming an amorphous carbon nitride film. The RAM 200c stores various pieces of data for forming an amorphous carbon nitride film. The controller 200 transmits a control signal to the high frequency power supply 130 for bias, the heater power supply 135, the gas supply source 155, the high frequency power supply 175 for plasma excitation, and the exhauster 185 through the interface 200d according to an command of the control program (recipe), and thus each device operates at a predetermined timing by the control signal. As such, the CPU 200a executes the data and the control program stored in the above component device area so that a desired amorphous carbon nitride film is formed on the wafer W.

A PC or a display (both not shown) operable by an operator is connected to the interface 200d, and the controller 200 reflects a command of the operator in the controlling of the plasma CVD apparatus 10. Also, the control program may be stored in a memory, such as a hard disk, an EEPROM, a DVD, or the like, or transmitted through a network.

(Method for Forming Amorphous Carbon Nitride Film)

Next, a method for forming an amorphous carbon nitride film according to the present embodiment will be described by using the plasma CVD apparatus 10.

First, the wafer W for forming the amorphous carbon nitride film is placed on the susceptor. Also, an inert gas, such as an Ar gas, or the like, is supplied to the inside of the processing container from the gas supply source 155, as a plasma excitation gas. At the same time, the inside of the processing container is exhausted by activating the exhauster 185, such that the inside of the processing container is maintained at a desired depressurization state. The high frequency power is applied to the shower head 150 from the high frequency power supply 175, and accordingly, the gas inside the processing container is plasmatized. Under this state, a gas containing a carbon monoxide gas and a nitrogen gas is supplied from the gas supply source 155. For example, a mixture gas of a carbon monoxide gas (CO), a nitrogen gas ($N_2$), and an argon gas (Ar) is introduced into the processing container. Here, an inert gas, such as an Ar gas, a He gas, an Ne gas, or the like, may not be supplied, but it is preferable that the inert gas is supplied with the carbon monoxide gas and the nitrogen gas so as to maintain uniform plasma.

Figure 2:
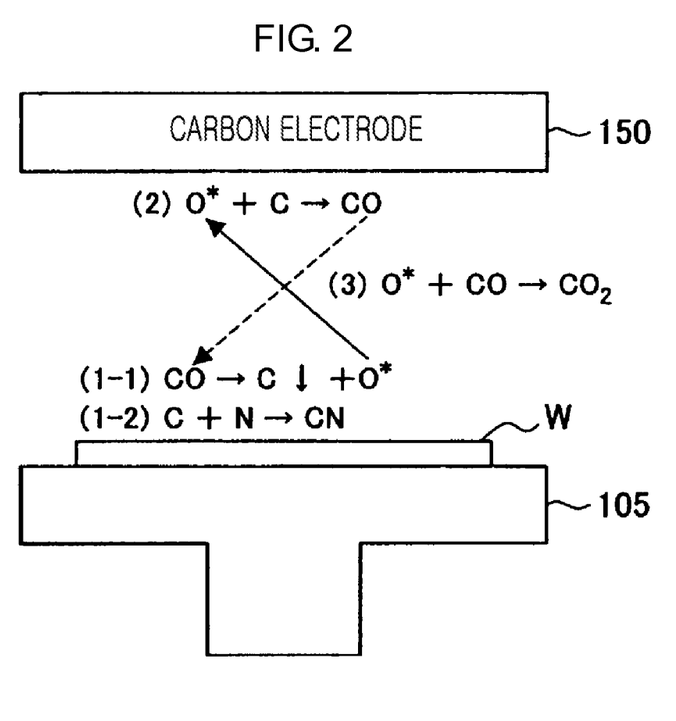
FIG. 2 is a diagram for explaining decomposition and generation reactions that occur while generating the amorphous carbon nitride film according to the same embodiment.

As a result, as shown in FIG. 2, the carbon monoxide gas (CO) is excited by plasma, and is decomposed (1-1: $CO \rightarrow C+O^*$) into carbon (C) and oxygen radical ($O^*$). Then, the generated carbon atoms (C) are deposited. A portion of the carbon atoms (C) is combined (1-2: $C+N \rightarrow CN$) with nitrogen atoms (N) decomposed from the nitrogen gas, and is mixed into the deposit of the carbon atoms (C). As such, the amorphous carbon nitride film is formed in a state where nitrogen is mixed into carbon.

Also, it is preferable that the shower head 150 is a carbon electrode because, as described above, the oxygen radicals ($O^*$) are generated when the carbon monoxide gas (CO) is decomposed, and thus, by constituting the shower head 150 to be a carbon electrode, the oxygen radicals ($O^*$) are used in a generation reaction of carbon monoxide (2: $O^*+C \rightarrow CO$), and thus the generated carbon monoxide (CO) is used to generate the amorphous carbon nitride film described above. As a result, a speed of forming the amorphous carbon nitride film may be improved. Also, a portion of the oxygen radicals ($O^*$) is used in a generation reaction of carbon dioxide (3: $O^*+CO \rightarrow CO_2$) inside the processing container, and thus the generated carbon dioxide ($CO_2$) is exhausted from the exhaust pipe 180.

During the film-forming, a temperature of the wafer W may be adjusted by operating the heater. For example, the temperature of the wafer W is adjusted to be below or equal to 350° C., preferably between 150 to 250° C. Also, a type of the plasma CVD apparatus 10 is not limited to a parallel plate type (capacity coupled type), and the plasma CVD apparatus 10 may be an inductively coupled plasma processing apparatus, a plasma processing apparatus that generates plasma by using microwaves, or a remote plasma processing apparatus. Specifically in a plasma processing apparatus using microwaves, plasma having a high electron density (Ne) and a low electron temperature (Te) may be generated. Accordingly, a temperature may be maintained low during a process, and thus the plasma processing apparatus using microwaves is more suitable to a backend process including a Cu wire.

Also, as occasion demands, the high frequency power for bias may be applied to the lower electrode 115 from the high frequency power supply 130, so that N ions in plasma are drawn toward a susceptor side. Accordingly, the N ions are definitely mixed into the amorphous carbon nitride film. Thus, as will be described later, reflectance of the amorphous carbon nitride film deteriorates, whereas the amorphous carbon nitride film becomes denser. Consequently, a high etching selectivity may be realized during dry-etching of an object film to be etched (target etching film) performed in a following process.

(Stacked Structure of Multilayer Film including Amorphous Carbon Nitride Film)

Figure 3:
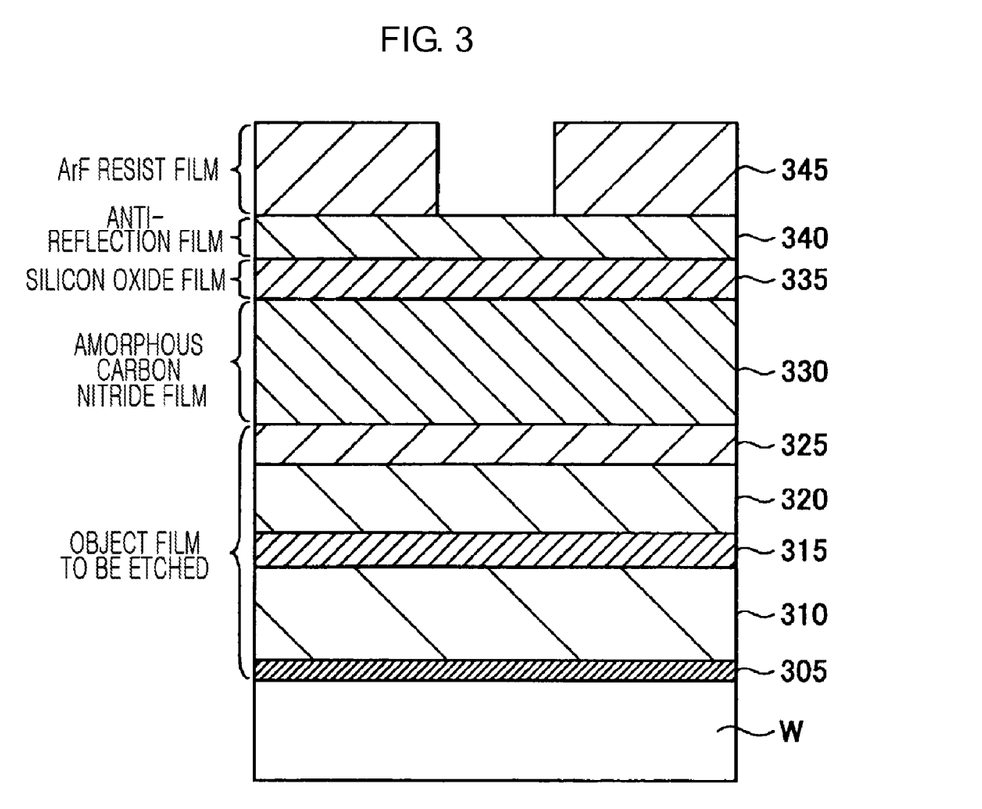
FIG. 3 is a longitudinal-sectional view showing a multi-layer film structure used to manufacture a semiconductor device by using the amorphous carbon nitride film according to the same embodiment.

Here, a stacked structure of a multilayer film including an amorphous carbon nitride film used to manufacture a semiconductor device will be described with reference to FIG. 3. An SiC film 305, an SiOC film (Low-k film) 310, an SiC film 315, an $SiO_2$ film 320, and an SiN film 325 are sequentially stacked on the wafer W, as an object film to be etched.

An amorphous carbon nitride film 330, a silicon oxide film 335 ($SiO_2$), an anti-reflection film 340 (DARC (registered trademark): dielectric anti-reflective coating), and an ArF resist film 345 are sequentially stacked on the object film to be etched. The ArF resist film 345 is an example of a photoresist film. The silicon oxide film 335 is an example of a silicon-based thin film. The anti-reflection film 340 may be formed of a silicon oxide film or a nitrated silicon oxide film. According to such a stacked structure, the ArF resist film 345, the anti-reflection film 340, the silicon oxide film 335, and the amorphous carbon nitride film 330 serve as a multilayer resist film in a method for manufacturing a semiconductor device, which will be described later. Also, it is preferable that the anti-reflection film 340 is included in the multilayer resist film, but the anti-reflection film 340 may not be included.

Regarding a film thickness of the object film that is to be etched, a thickness of the SiC film 305 may be 30 nm, a thickness of the SiOC film (Low-k film) 310 may be 150 nm, a thickness of the SiC film 315 may be 30 nm, a thickness of the $SiO_2$ film 320 may be 150 nm, and a thickness of the SiN film 325 may be 70 nm. Regarding a film thickness of the multilayer resist film, a thickness of the amorphous carbon nitride film 330 may be from 100 to 800 nm (for example, 280 nm), a thickness of the silicon oxide film 335 may be from 10 to 100 nm (for example, 50 nm), a thickness of the anti-reflection film 340 (DARC) may be from 30 to 100 nm (for example, 70 nm), and a thickness of the ArF resist film 345 may be below or equal to 200 nm (for example, 180 nm). Alternatively, another silicon-based thin film, such as SiOC, SiON, SiCN, SiCNH, or the like, may be used instead of the silicon oxide film 335.

(Method for Manufacturing Semiconductor Device)

Figure 4:
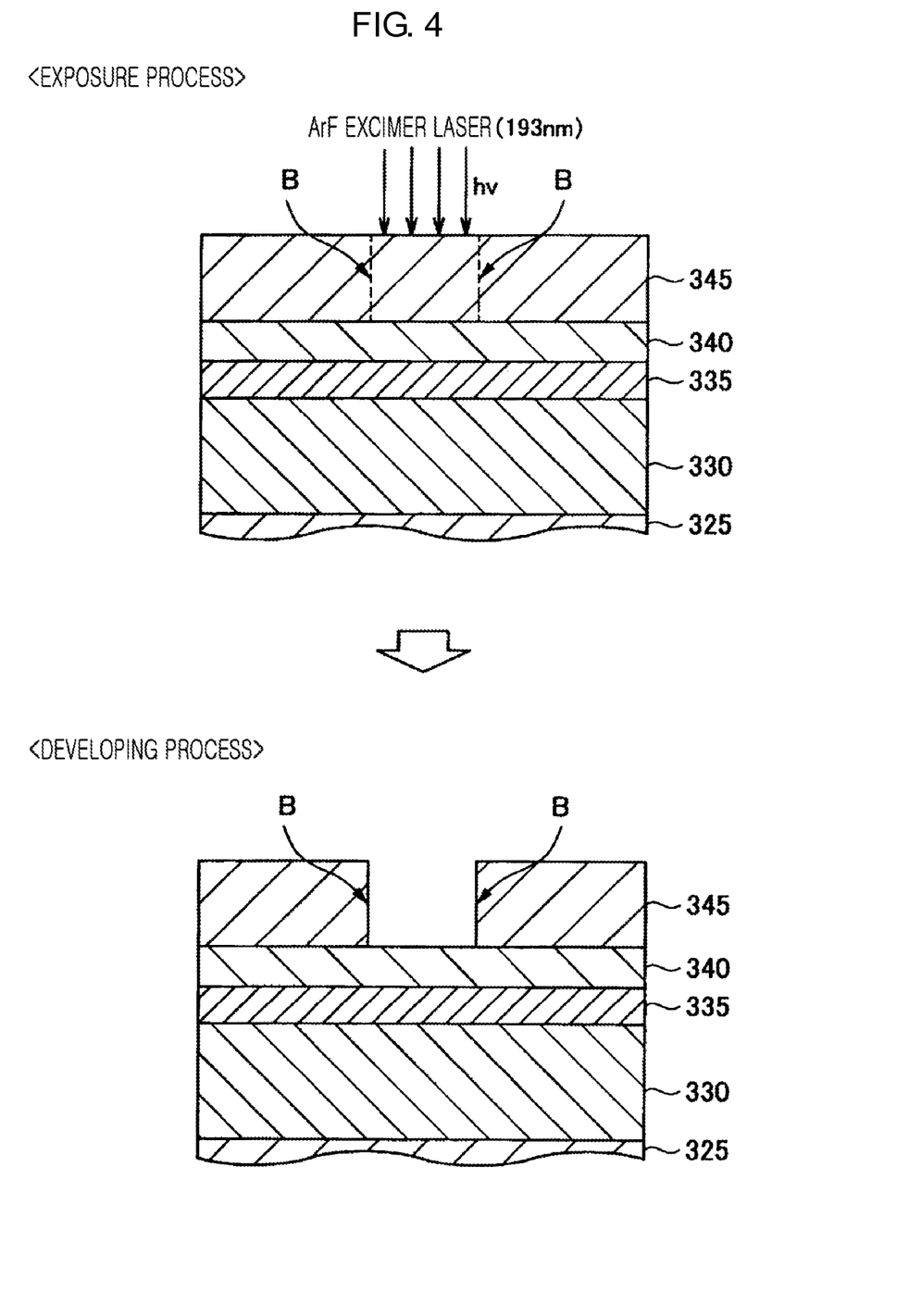
FIG. 4 is a view for explaining a process of patterning an ArF resist film by lithography, according to the same embodiment.
Figure 5:
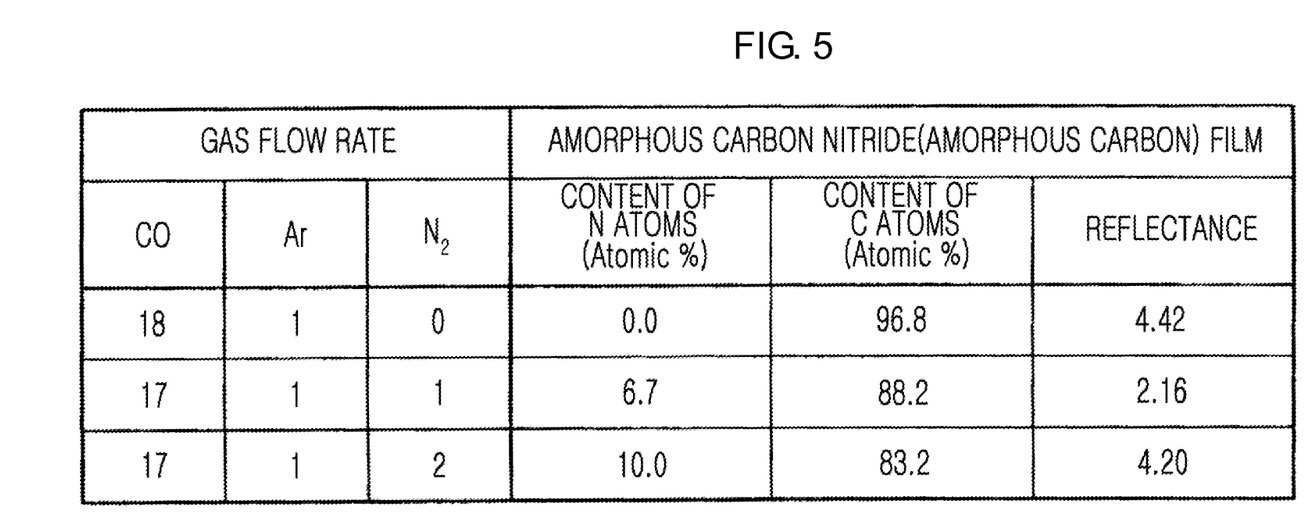
FIG. 5 shows results of experiments showing reflectance of the amorphous carbon nitride film according to the same embodiment.
Figure 6:
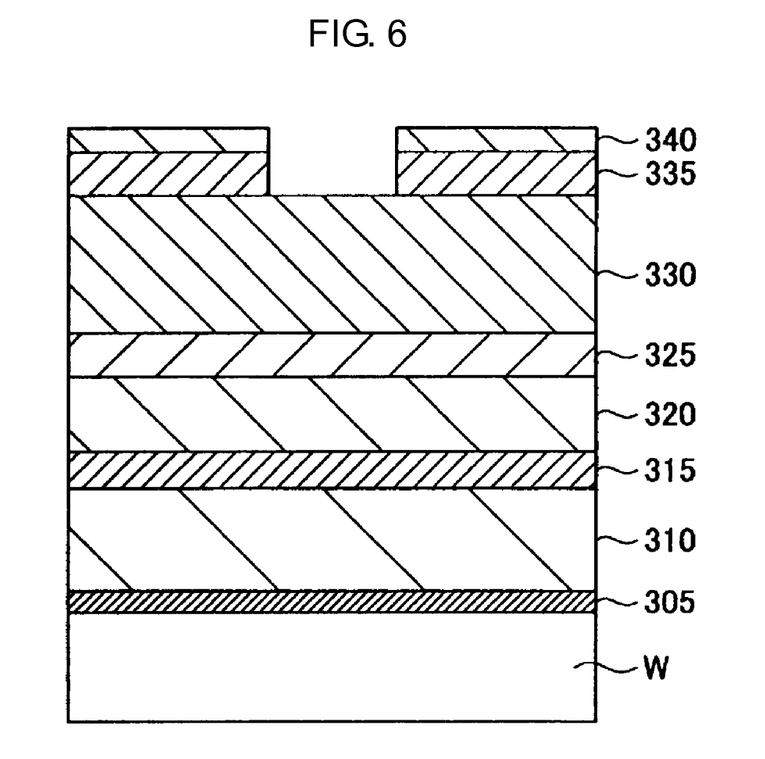
FIG. 6 is a cross-sectional view showing a result of etching a silicon oxide film by using the patterned ArF resist film as a mask, according to the same embodiment.
Figure 7:
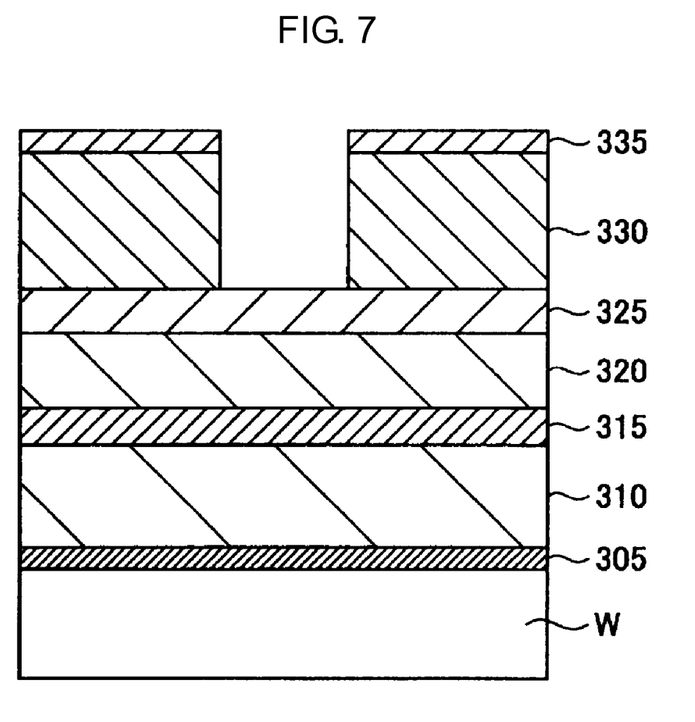
FIG. 7 is a cross-sectional view showing a result of etching the amorphous carbon nitride film by using the patterned silicon oxide film as a mask, according to the same embodiment.
Figure 8:
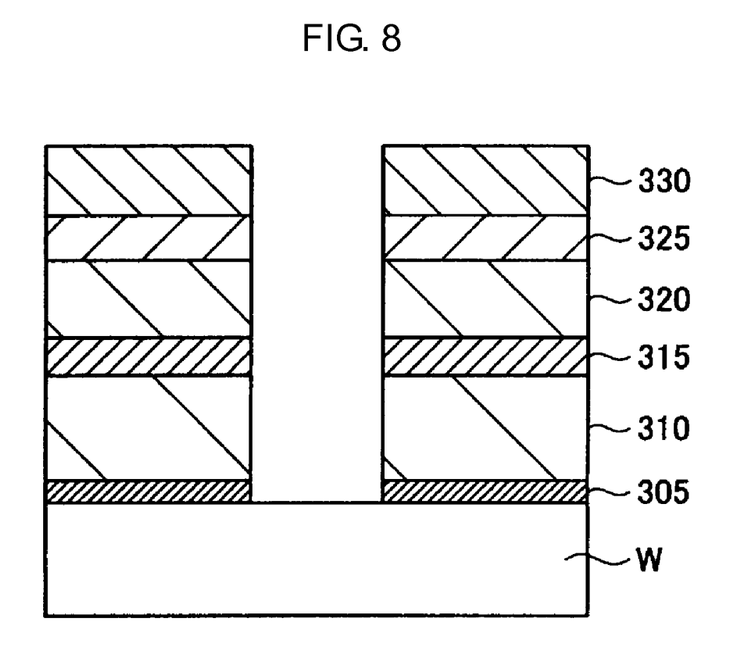
FIG. 8 is a cross-sectional view showing a result of etching an object film to be etched by using the patterned amorphous carbon nitride film as a mask, according to the same embodiment.

Next, a method for manufacturing a semiconductor device applied to the multilayer film having the above-described stacked structure will be described with reference to FIGS. 4 through 8. FIG. 4 is a view for explaining patterning of an ArF resist film by photolithography. FIG. 5 is a diagram showing measured values of reflectance of an amorphous carbon film and an amorphous carbon nitride film. FIGS. 6 through 8 are views for explaining patterning of a multilayer film by etching.

(Patterning by Photolithography)

First, patterning of an ArF resist film by photolithography will be described. As shown in an exposure process of an upper portion of FIG. 4, a pattern of a mask, not shown, is projected onto the ArF resist film 345 by exposing the ArF resist film 345 to ArF excimer laser having a wavelength of 193 nm. FIG. 4 shows a boundary portion B of a pattern as part of the projected pattern. The exposed portion of the ArF resist film 345 is removed as shown in a developing process of a lower portion of FIG. 4, and thus patterning of the ArF resist film 345 is completed.

When the patterning is performed by photolithography as mentioned above, a laser beam penetrates through a base of the ArF resist film 345. Here, the light is suppressed from reflecting to the ArF resist film due to the anti-reflection film 340. However, light that is transmitted through the anti-reflection film 340 may be additionally reflected at an underlayer film thereof. Here, the reflected light exposes the ArF resist film 345. As a result, even if the sharp pattern B is accurately projected onto the ArF resist film 345 by incident light, the boundary portion B of the pattern projected onto the ArF resist film 345 becomes vague and accurate patterning is disturbed due to unnecessary exposure on the ArF resist film 345 by the reflected light, which is not controlled. Accordingly, in the present embodiment, reflection is suppressed by using the amorphous carbon nitride film 330, which is described below.

(Reflectance of Amorphous Carbon Nitride Film)

In the amorphous carbon nitride film 330 according to the present embodiment, nitrogen atoms are mixed into amorphous carbon. After having conducted research, the inventor has discovered that reflectance of a 193 nm light reflected by the amorphous carbon nitride film 330 changes according to an amount of added N atoms, as shown in FIG. 5.

In order to perform an experiment of FIG. 5, the inventor first formed the amorphous carbon nitride film by using the plasma CVD apparatus 10. In detail, each component device of the plasma CVD apparatus 10 was controlled as follows, based on a command signal from the controller 200. In other words, after loading the wafer, an Ar gas was supplied into the processing container from the gas supply source 155 through the gas line L and the shower head 150, while exhausting the inside of the processing container by using the exhauster 185, thereby maintaining the inside of the processing container at a depressurization state of 20 mTorr. Also, the temperature inside the processing container was adjusted in such a way that temperatures of an upper wall, a lower wall, and the susceptor 105 were respectively 60° C., 50° C., and 40° C. The high frequency power of 4.0 W/cm$^2$ was applied from the high frequency power supply 175 to the shower head (upper electrode) 150. The high frequency power for bias was not applied. A gap between the shower head 150 and the susceptor 105 was 30 cm. After an atmosphere inside the processing container was stabilized, a mixture gas of a carbon monoxide (CO) gas, an argon (Ar) gas, and a nitrogen ($N_2$) gas was supplied from the gas supply source 155.

When a gas flow rate of CO/Ar/$N_2$ was 18:1:0, a content of C atoms included in an amorphous carbon film (referred to as film 1) was 96.8 (Atomic %) since nitrogen was not added. As such, when a 193 nm laser beam was incident on the amorphous carbon film not including N atoms, a ratio of reflected light to the incident light, i.e., reflectance, was 4.42.

Meanwhile, when the gas flow rate of CO/Ar/$N_2$ was 17:1:1, contents of N atoms and C atoms included in the amorphous carbon nitride film 330 (referred to as film 2) were respectively 6.7 and 88.2 (Atomic %). This means that the N atom content in the amorphous carbon nitride film is about 7.6% with respect to the C atom content. Here, when the 193 nm laser beam was incident on the amorphous carbon nitride film 330, the reflectance decreased to 2.16.

Alternatively, when the gas flow rate of CO/Ar/$N_2$ was 17:1:2, contents of N atoms and C atoms included in the amorphous carbon nitride film 330 (referred to as film 3) were respectively 10.0 and 83.2 (Atomic %). This means that the N atom content in the amorphous carbon nitride film is about 12% with respect to the C atom content. Here, when the 193 nm laser beam was incident on the amorphous carbon nitride film 330, the reflectance increased to 4.20.

As described above, the inventor has discovered that if the content of N atoms added into the amorphous carbon nitride film 330 is below or equal to about 10% of the content of C atoms, a lithography process can be performed without reflecting most of laser beams of 193 nm toward the ArF resist film 345. Accordingly, the inventor was able to accurately form a pattern on the ArF resist film 345 by using the amorphous carbon nitride film 330 whose content of N atoms with respect to the C atoms is below or equal to 10%.

(Patterning by Etching)

Next, a process of transferring a pattern formed on the ArF resist film 345 to an underlayer film thereof by etching will be described. The anti-reflection film 340 and the silicon oxide film 335 are etched by plasma by using the plasma CVD apparatus 10, wherein the ArF resist film 345 in the state shown in FIG. 3 is used as an etching mask. As a result, as shown in FIG. 6, the pattern of the ArF resist film 345 is transferred to the silicon oxide film 335. Since etching resistance of the ArF resist film 345 is low, the ArF resist film 345 is removed during the present process. Also, the anti-reflection film 340 is thinned via etching.

Next, the amorphous carbon nitride film 330 is etched by plasma by using the plasma CVD apparatus 10 and using the silicon oxide film 335 in the state shown in FIG. 6 as an etching mask. As a result, as shown in FIG. 7, the pattern of the ArF resist film 345 is transferred to the amorphous carbon nitride film 330. As will be described later, the amorphous carbon nitride film 330 has sufficient plasma resistance. Accordingly, in the present process, the amorphous carbon nitride film 330 is etched while maintaining a good shape. As a result, the pattern of the ArF resist film 345 can be accurately transferred to the amorphous carbon nitride film 330.

Next, the SiN film 325, the $SiO_2$ film 320, the SiC film 315, the SiOC film (Low-k film) 310, and the SiC film 305 are sequentially etched as the object film to be etched by using the plasma CVD apparatus 10 and using the amorphous carbon nitride film 330 in the state shown in FIG. 7 as an etching mask. As described above, since the plasma resistance (etching resistance) of the amorphous carbon nitride film 330 is high, the amorphous carbon nitride film 330 has high etching selectivity with respect to the object film to be etched, during etching. As a result, the amorphous carbon nitride film 330 sufficiently remains as the etching mask until the SiC film 305 is completely etched, and thus an accurate pattern transfer is possible without generating deformations in the pattern of the object film to be etched. Also, after the etching ends, the amorphous carbon nitride film 330 is ashed by an $O_2$-based gas, and thus as shown in FIG. 8, the patterning of the object film to be etched is completed while the amorphous carbon nitride film 330 is removed. Also, a mixture gas of an $O_2$ gas and Ar, a mixture gas of an $O_2$ gas and $N_2$, or a mixture gas of an $N_2$ gas and an $H_2$ gas may be used for ashing.

(Plasma Resistance of Amorphous Carbon Nitride Film)

Figure 9:
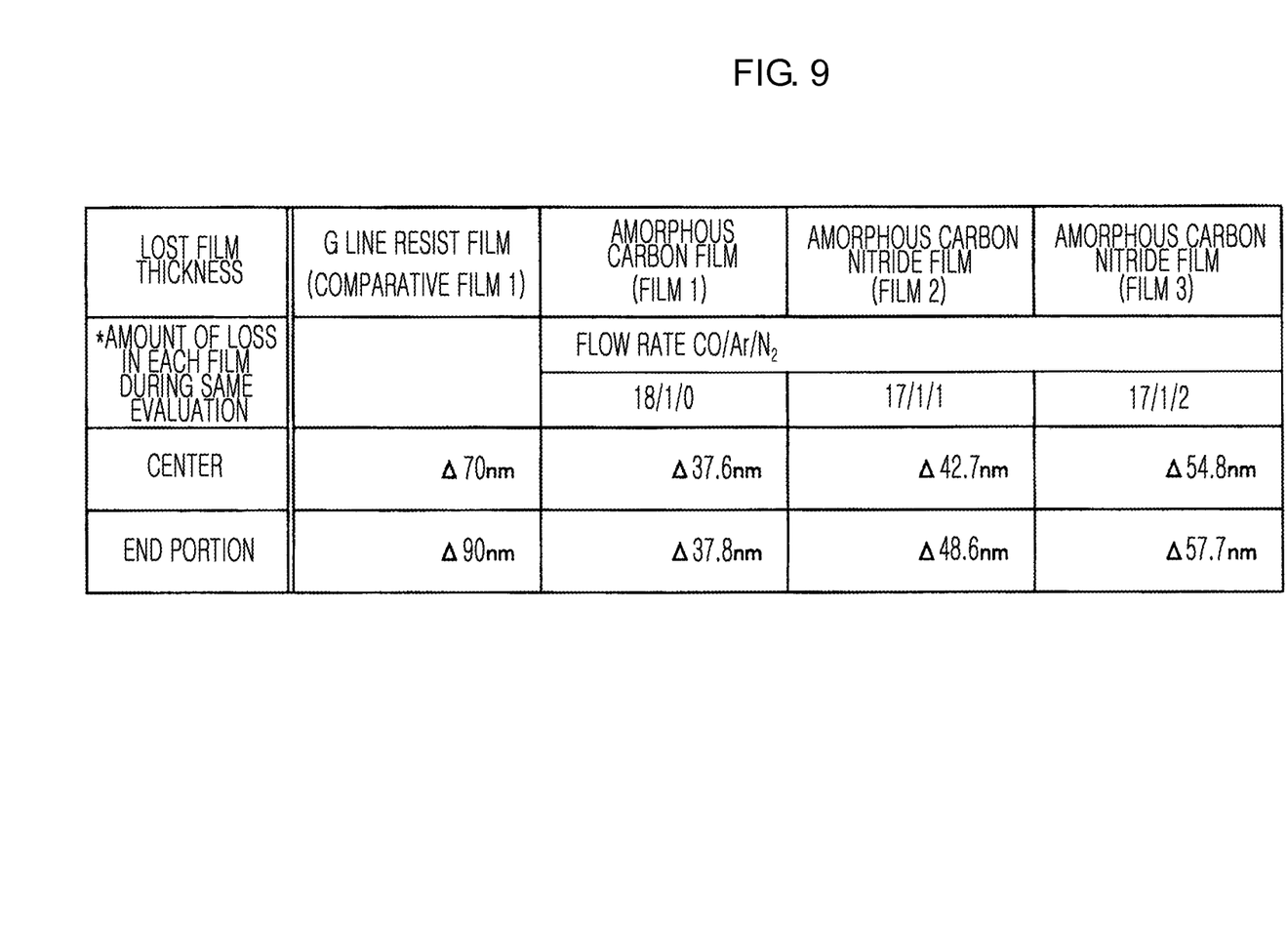
FIG. 9 shows results of experiments for evaluating plasma resistance of the amorphous carbon nitride film according to the same embodiment.

The experiments performed by the inventor with respect to the plasma resistance of the amorphous carbon nitride film described above will now be described. Process conditions were almost similar to those of forming the amorphous carbon nitride film, and the inside of the processing container was maintained at a depressurization state of 20 mTorr and the temperature inside the processing container was adjusted so that the temperatures of the upper wall, the lower wall, and the susceptor 105 were respectively 60° C., 50° C., and 40° C. The high frequency power of 4.0 W/cm$^2$ output from the high frequency power supply 175 was applied to the shower head (upper electrode) 150 for 15 seconds. The high frequency power for bias was not applied. The gap between the shower head 150 and the susceptor 105 was 30 cm.

After the atmosphere inside the processing container was stabilized, amount of loss in each film mentioned below were measured. In detail, the same evaluation was performed on a resist film (comparative film 1) which is used for a light source (g line) of a wavelength of 436 nm, the amorphous carbon film (film 1), and the amorphous carbon nitride films (films 2 and 3) under the process conditions. The results are shown in FIG. 9. In FIG. 9, the comparative film 1 was lost by $\Delta$70 nm at a center thereof and by $\Delta$90 nm at an end portion thereof while the object film to be etched was etched for 15 seconds. In other words, the comparative film 1 was thinned by 70 nm at the center thereof and by 90 nm at the end portion thereof during the etching for 15 seconds.

Meanwhile, the films 1, 2, and 3 were lost respectively by $\Delta$37.6 nm, $\Delta$42.7 nm, and $\Delta$54.8 nm at centers thereof and by $\Delta$37.8 nm, $\Delta$48.6 nm, and $\Delta$57.7 nm at end portions thereof. As a result, it was discovered that the plasma resistance of the amorphous carbon nitride film 330 was higher than that of the resist film which is used for the light source (g line) of the wavelength of 436 nm. Moreover, in-plane uniformity of the amorphous carbon nitride film 330 with respect to etching is higher than that of the resist film in which g line is used. It is understood through experience that the resist film for g line has sufficient plasma resistance in terms of practicality. Accordingly, it is proved through this experiment that the amorphous carbon nitride film, which has lower amount of loss in film and high in-plane uniformity during etching, has an etching selectivity equal to or above that of the resist film for g line, and is an excellent film that is durable for practical uses.

When the above descriptions are simply summarized, the method for manufacturing the semiconductor device, according to the present embodiment, includes at least following processes.

(a) Forming an object film to be etched on a wafer (b) Supplying a process gas containing a carbon monoxide gas and a nitrogen gas into a processing container (c) Forming an amorphous carbon nitride film 330 on the wafer by decomposing the carbon monoxide gas and the nitrogen gas inside the processing container (d) Forming a silicon oxide film 335 on the amorphous carbon nitride film 330

(e) Forming an ArF resist film 345 on the silicon oxide film 335

(f) Patterning the ArF resist film 345

(g) Etching the silicon oxide film 335 by using the ArF resist film 345 as an etching mask (h) Etching the amorphous carbon nitride film 330 by using the silicon oxide film 335 as an etching mask, thereby transferring the pattern of the ArF resist film 345)

(i) Etching the object film to be etched by using the amorphous carbon nitride film 330 as an etching mask Accordingly, an accurate pattern may be transferred to the object film to be etched by using the amorphous carbon nitride film 330, which has excellent etching resistance and is capable of reducing reflectance of irradiated light when the ArF resist film 345 is exposed to a 193 nm laser beam.

While this invention has been particularly shown and described with reference to exemplary embodiments thereof, the present invention is limited thereto. It will be understood by those skilled in the art that various changes in form and details may be made therein without departing from the spirit and scope of the invention as defined by the appended claims.

For example, in the above embodiments, the amorphous carbon nitride film of the present invention is applied to a lower layer of the multi resist films in a dry-developing technology, but the present invention is not limited thereto, and the amorphous carbon nitride film may be used variously, such as using the amorphous carbon nitride film as an etching mask having an anti-reflection film function by forming the film directly below a conventional photoresist film.

Also for example, in the above embodiments, the gas used to form the amorphous carbon nitride film is a carbon monoxide gas, but a carbon dioxide gas may be used according to a process.

Also, in the above embodiments, the semiconductor wafer is exemplified as a target object, but the present invention is not limited thereto, and the target object may be another substrate, such as a glass substrate for flat panel display (FPD) represented as a liquid crystal display (LCD), or the like.

The invention claimed is:

1. A method for forming an amorphous carbon nitride film, the method comprising:

disposing a target object inside a processing container;

supplying a process gas, which contains a carbon monoxide gas and a nitrogen gas and does not contain hydrogen atoms in molecules, into the processing container; and forming an amorphous carbon nitride film on the target object by decomposing the carbon monoxide gas and the nitrogen gas inside the processing container, wherein the amorphous carbon nitride film is formed on the target object by using a CVD apparatus in which the target object is placed between an upper electrode and a lower electrode, and the upper electrode is a carbon electrode.

2. The method of claim 1, wherein a content of nitrogen atoms in the amorphous carbon nitride film is below or equal to 10% of carbon atoms contained in the same film.

3. The method of claim 1, wherein the CVD apparatus is a plasma CVD apparatus.

4. The method of claim 3, wherein the plasma CVD apparatus is a parallel plate type in which the upper electrode and the lower electrode are provided inside the processing container, and generates plasma from the process gas by applying high frequency power to at least the upper electrode in a state where the target object is disposed on the lower electrode.

5. The method of claim 4, wherein high frequency power for bias is applied to the lower electrode.

6. The method of claim 1, wherein the process gas includes an inert gas.

7. A method for manufacturing a semiconductor device, the method comprising:
　forming an object film to be etched on a target object;
　supplying a process gas, which contains a carbon monoxide gas and a nitrogen gas and does not contain hydrogen atoms in molecules, into a processing container;
　forming an amorphous carbon nitride film on the target object by decomposing the carbon monoxide gas and the nitrogen gas inside the processing container;
　forming a silicon-based thin film on the amorphous carbon nitride film;
　forming a photoresist film on the silicon-based thin film;
　patterning the photoresist film;
　etching the silicon-based thin film by using the photoresist film as an etching mask;
　etching the amorphous carbon nitride film by using the silicon-based thin film as an etching mask; and
　etching the object film to be etched by using the amorphous carbon nitride film as an etching mask,
　wherein the amorphous carbon nitride film is formed on the target object by using a CVD apparatus in which the target object is placed between an upper electrode and a lower electrode, and the upper electrode is a carbon electrode.

8. The method of claim 7, wherein the photoresist film is an ArF resist film and is patterned by using light having a wavelength of 193 nm.

9. A non-transitory computer readable storage medium having recorded thereon a control program operating in a computer, wherein the control program controls a film-forming apparatus for forming an amorphous carbon nitride film in such a way that the method of claim 1 is executed.

10. A method for forming an amorphous carbon nitride film, the method comprising:
　disposing a target object inside a processing container;
　supplying a process gas into the processing container, wherein the process gas includes a nitrogen gas and a first gas and does not include hydrogen atoms in molecules, and the first gas contains only carbon atoms and oxygen atoms; and
　forming an amorphous carbon nitride film on the target object by using plasma inside the processing container,
　wherein the amorphous carbon nitride film is formed on the target object by using a CVD apparatus in which the target object is placed between an upper electrode and a lower electrode, and the upper electrode is a carbon electrode.

\* \* \* \* \*